(12) United States Patent
Doering et al.

(10) Patent No.: US 12,408,239 B2
(45) Date of Patent: Sep. 2, 2025

(54) PBN HEATERS FOR ALD TEMPERATURE UNIFORMITY

(71) Applicant: Applied Materials, Inc., Santa Clara, CA (US)

(72) Inventors: Kenneth Brian Doering, San Jose, CA (US); Gregory J. Wilson, Kalispell, MT (US); Karthik Ramanathan, Bangalore (IN); Mario D. Silvetti, Morgan Hill, CA (US); Kevin Griffin, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1204 days.

(21) Appl. No.: 16/971,409

(22) PCT Filed: Feb. 20, 2019

(86) PCT No.: PCT/US2019/018668
§ 371 (c)(1),
(2) Date: Aug. 20, 2020

(87) PCT Pub. No.: WO2019/164865
PCT Pub. Date: Aug. 29, 2019

(65) Prior Publication Data
US 2021/0092800 A1    Mar. 25, 2021

Related U.S. Application Data

(60) Provisional application No. 62/632,748, filed on Feb. 20, 2018.

(51) Int. Cl.
*H05B 3/14* (2006.01)
*C23C 16/455* (2006.01)
(Continued)

(52) U.S. Cl.
CPC ....... *H05B 3/143* (2013.01); *C23C 16/45544* (2013.01); *H05B 3/0019* (2013.01); *H05B 3/03* (2013.01)

(58) Field of Classification Search
CPC .......... H05B 1/02; H05B 3/0019; H05B 3/03; H05B 3/143; H05B 3/141; H05B 3/145;
(Continued)

(56) References Cited

U.S. PATENT DOCUMENTS 7,020,537 B2   3/2006   Wilson et al.
7,160,421 B2   1/2007   Wilson et al.
(Continued)

FOREIGN PATENT DOCUMENTS

CN    105514014 A    4/2016
CN    105957820 A    9/2016
(Continued)

OTHER PUBLICATIONS

English translation to JP2008098513 (Year: 2006).*
(Continued)

*Primary Examiner* — Sang Y Paik
*Assistant Examiner* — Bonita Khlok
(74) *Attorney, Agent, or Firm* — Servilla Whitney LLC

(57) ABSTRACT

Heaters having a body with having a top and bottom comprising pyrolytic boron nitride (PBN), a first heater electrode and a second heater electrode are described. The heater electrodes can be enclosed within an electrically insulating standoff and connected to separate busbars to provide power. Heater assemblies including one or more of the heaters and processing chambers including the heater assemblies are also described.

14 Claims, 7 Drawing Sheets

(51) Int. Cl.
*H05B 3/00* (2006.01)
*H05B 3/03* (2006.01)

(58) Field of Classification Search
CPC . H05B 3/06; H05B 3/146; H05B 3/14; H05B 3/12; H01L 21/67103; H01L 21/68764; H01L 21/68757; H01L 21/68771; H01L 21/6831; H01L 21/67248; C23C 16/46; C23C 16/45544; C23C 16/45551; C23C 16/4584
USPC .............................................. 219/444.1, 438
See application file for complete search history.

(56) References Cited

U.S. PATENT DOCUMENTS

| | | | |
|---|---|---|---|
| 7,189,318 B2 | 3/2007 | Wilson et al. | |
| 7,751,908 B2 | 7/2010 | Chang et al. | |
| 8,399,809 B1 | 3/2013 | Bourez | |
| 9,023,664 B2 | 5/2015 | Chang et al. | |
| 2002/0108714 A1 | 8/2002 | Doering et al. | |
| 2004/0074898 A1* | 4/2004 | Mariner | H01L 21/68757 219/465.1 |
| 2007/0131674 A1 | 6/2007 | Kushihashi et al. | |
| 2011/0039399 A1 | 2/2011 | Suzuki et al. | |
| 2012/0085747 A1* | 4/2012 | Chao | H01L 21/68757 219/444.1 |
| 2014/0263281 A1* | 9/2014 | Kano | H05B 3/06 219/544 |
| 2015/0228513 A1 | 8/2015 | Parkhe et al. | |
| 2016/0126125 A1 | 5/2016 | Okugawa et al. | |
| 2016/0270150 A1* | 9/2016 | Furutani | H05B 3/26 |
| 2019/0177847 A1* | 6/2019 | Tomizawa | C23C 16/4586 |
| 2020/0340102 A1* | 10/2020 | Kimura | H01L 21/02274 |

FOREIGN PATENT DOCUMENTS

| | | | |
|---|---|---|---|
| JP | S6214923 A | | 1/1987 |
| JP | H07315935 A | | 12/1995 |
| JP | 2002184558 A | | 6/2002 |
| JP | 2003059789 A | | 2/2003 |
| JP | 2008098513 | * | 10/2006 |
| JP | 2007157661 A | | 6/2007 |
| JP | 2009149964 A | | 7/2009 |
| JP | 2013191626 | * | 9/2013 |
| JP | 2016076646 A | | 5/2016 |
| JP | 2016171066 A | | 9/2016 |
| KR | 20160041758 A | | 4/2016 |
| KR | 20160110130 A | | 9/2016 |
| WO | 2008008585 A2 | | 1/2008 |
| WO | 2015183661 A1 | | 12/2015 |

OTHER PUBLICATIONS

English translation to JP 2013191626 (Year: 2013).*
PCT International Search Report and Written Opinion in PCT/US2019/018668 dated Jun. 5, 2019, 13 pages.

* cited by examiner

PBN HEATERS FOR ALD TEMPERATURE UNIFORMITY

CROSS-REFERENCE TO RELATED APPLICATIONS

This application is the National Stage entry of PCT/US2019/018668, filed on Feb. 20, 2019, which claims priority to U.S. Provisional Application Ser. No. 62/632,748, filed Feb. 20, 2018, the entire disclosures of which are hereby incorporated by reference herein.

FIELD

Embodiments of the disclosure generally relate to apparatus for processing substrates. More particularly, embodiments of the disclosure relate to heaters for batch processing chambers.

BACKGROUND

Atomic Layer Deposition (ALD) and Plasma-Enhanced ALD (PEALD) are deposition techniques that offer control of film thickness and conformality in high-aspect ratio structures. Due to continuously decreasing device dimensions in the semiconductor industry, there is increasing interest and applications that use ALD/PEALD. In some cases, only PEALD can meet specifications for desired film thickness and conformality.

Semiconductor device formation is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single processing step on substrates; the additional chambers are intended to maximize the rate at which substrates are processed by the platform. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

During processing, substrates are often heated using tubular heaters which have an upper temperature limit of about 750° C. While the heaters may reach that temperature, the substrate or susceptor assembly being heated typically does not go above about 550° C. The watt density of a tubular heater is high from a central heating wire which radiating 360° from a tubular shape results in a low power density toward the wafer (~30 watts/cm$^2$). Additionally, tubular heaters operating at 750° C. have about a three to six month life span.

Accordingly, there is a need in the art for apparatus that can heat a wafer to temperatures greater than 550° C., have a longer lifetime and/or higher watt densities.

SUMMARY

One or more embodiments of the disclosure are directed to heaters comprising a body having a top and bottom. The body comprises pyrolytic boron nitride (PBN). A first heater electrode is connected to the bottom of the body and a second heater electrode is connected to the bottom of the body.

Additional embodiments of the disclosure are directed to heater assemblies comprising a round body having a bottom with an opening in a center of the body and sidewall forming an outer periphery of the body around the bottom. The sidewall and bottom define a cavity within the body. A heater zone is within the cavity of the body. The heater zone comprises one or more heater with a heater body comprising pyrolytic boron nitride (PBN), a first heater electrode connected to a bottom of the heater body and a second heater electrode connected to the bottom of the heater body. A first busbar is electrically connected to the first heater electrode and a second busbar is electrically connected to the second heater electrode and electrically isolated from the first busbar.

BRIEF DESCRIPTION OF THE DRAWINGS

So that the manner in which the above recited features of embodiments of the disclosure can be understood in detail, a more particular description of embodiments of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure provide a substrate processing system for continuous substrate deposition to maximize throughput and improve processing efficiency. One or more embodiments of the disclosure are described with respect to a spatial atomic layer deposition chamber.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

As used in this specification and the appended claims, the terms "pie-shaped" and "wedge-shaped" are used interchangeably to describe a body that is a sector of a circle. For example, a wedge-shaped segment may be a fraction of a circle or disc-shaped structure and multiple wedge-shaped segments can be connected to form a circular body. The sector can be defined as a part of a circle enclosed by two radii of a circle and the intersecting arc. The inner edge of the pie-shaped segment can come to a point or can be truncated to a flat edge or rounded. In some embodiments, the sector can be defined as a portion of a ring or annulus.

The path of the substrates can be perpendicular to the gas ports. In some embodiments, each of the gas injector assemblies comprises a plurality of elongate gas ports which extend in a direction substantially perpendicular to the path traversed by a substrate, where a front face of the gas distribution assembly is substantially parallel to the platen. As used in this specification and the appended claims, the term "substantially perpendicular" means that the general direction of movement of the substrates is along a plane approximately perpendicular (e.g., about 45° to 90°) to the axis of the gas ports. For a wedge-shaped gas port, the axis of the gas port can be considered to be a line defined as the mid-point of the width of the port extending along the length of the port.

Figure 1:
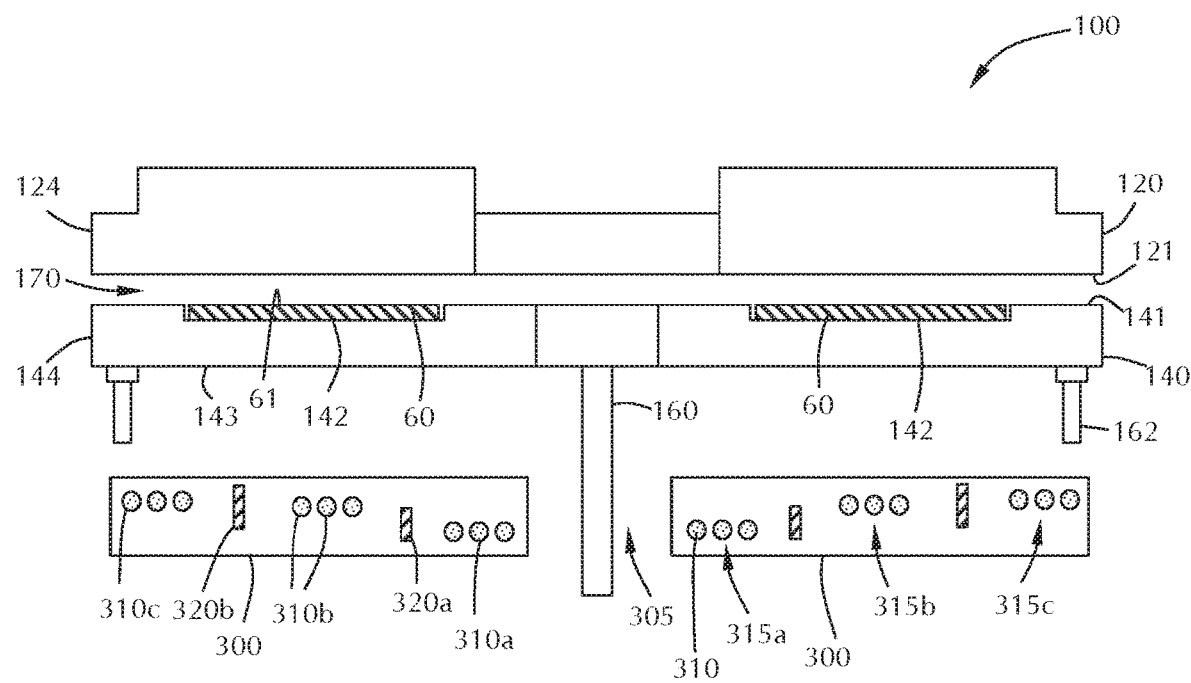
FIG. 1 shows a schematic cross-sectional view of a substrate processing system in accordance with one or more embodiments of the disclosure.

FIG. 1 shows a cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer peripheral edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. While various types of gas distribution assemblies can be employed (e.g., showerheads), embodiments of the disclosure may be particularly useful with spatial ALD gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. The plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s). A substrate moving from one end of the gas distribution assembly to the other end will be exposed to each of the process gases in turn, forming a layer on the substrate surface.

Figure 2:
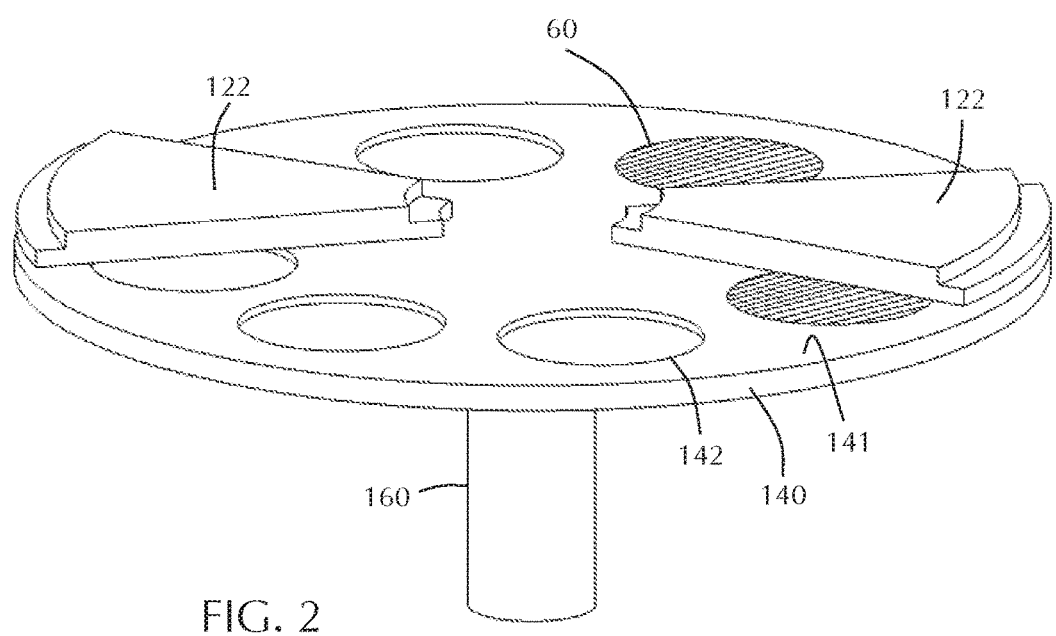
FIG. 2 shows a perspective view of a substrate processing system in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

The susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm. The recess 142 of some embodiments supports a wafer so that the inner diameter (ID) of the wafer is located within the range of about 170 mm to about 185 mm from the center (axis of rotation) of the susceptor. In some embodiments, the recess 142 supports a wafer so that the outer diameter (OD) of the wafer is located in the range of about 470 mm to about 485 mm from the center (axis of rotation) of the susceptor.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120. In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
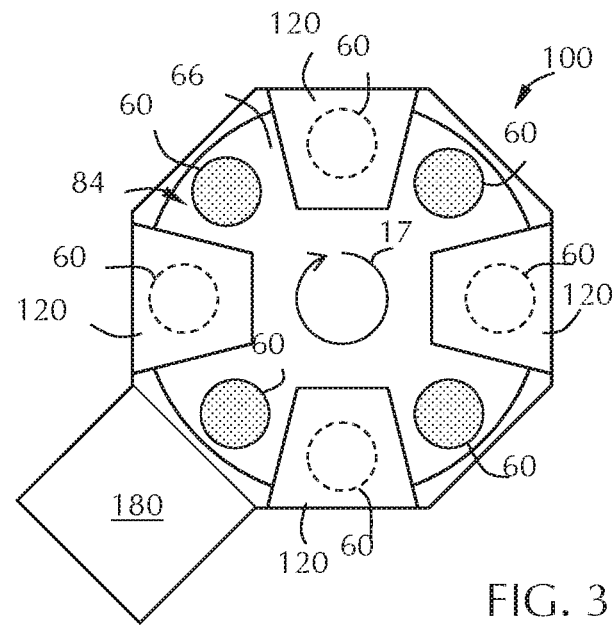
FIG. 3 shows a schematic of a substrate processing system in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to an gas distribution assembly 120 for film deposition, as illustrated by the dotted circle under the gas distribution assemblies 120. An additional 45° rotation would move the substrates 60 away from the injector assemblies 30. With spatial ALD injectors, a film is deposited on the wafer during movement of the wafer relative to the injector assembly. In some embodiments, the susceptor assembly 140 is rotated in increments that prevent the substrates 60 from stopping beneath the gas distribution assemblies 120. The number of substrates 60 and gas distribution assemblies 120 can be the same or different. In some embodiments, there is the same number of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal, however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the processing chamber 100. A wafer robot may be positioned in the chamber 180 to move the substrate onto the susceptor.

Rotation of the carousel (e.g., the susceptor assembly 140) can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
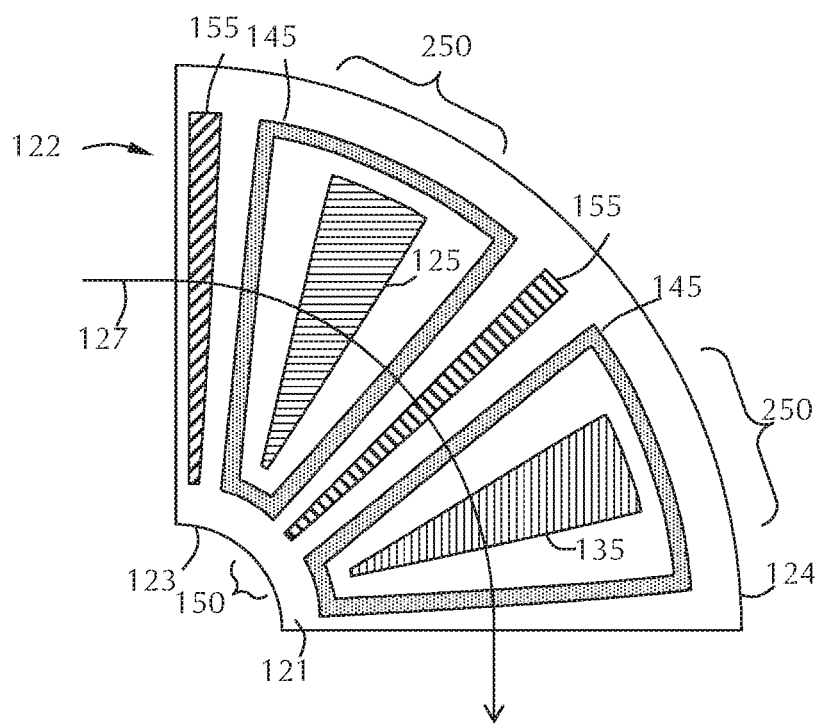
FIG. 4 shows a schematic view of a front of an injector unit in accordance with one or more embodiment of the disclosure.
Figure 5:
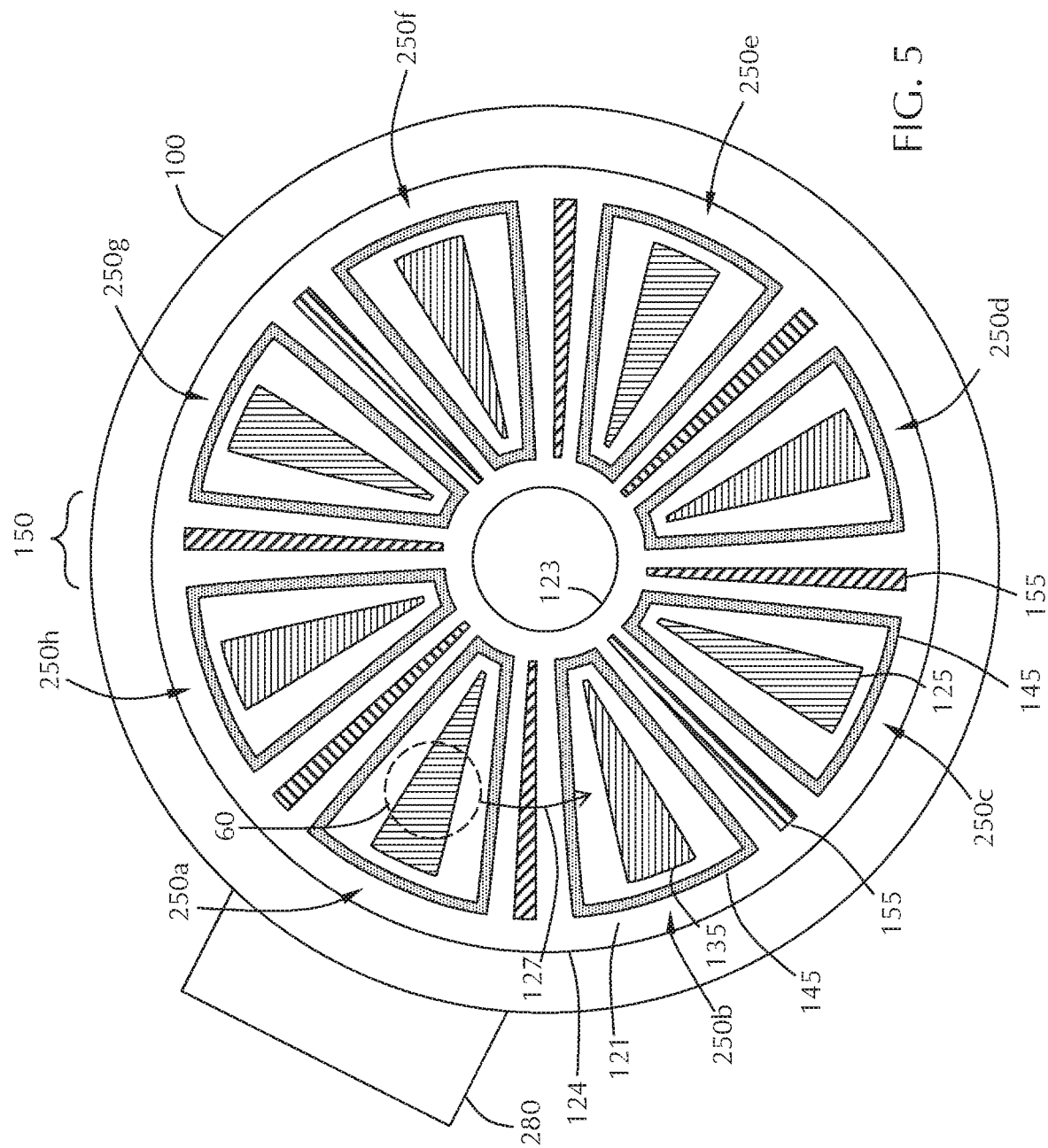
FIG. 5 shows a schematic view of a front of a gas distribution assembly in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second reactive gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 145 in a front surface 121 of the gas distribution assembly 220. The plurality of elongate gas ports 125, 135, 145 and vacuum ports 155 extend from an area adjacent the inner peripheral edge 123 toward an area adjacent the outer peripheral edge 124 of the gas distribution assembly 220. The plurality of gas ports shown include a first reactive gas port 125, a second reactive gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second reactive gas port 135 and a vacuum port 145. Thus, at the end of the path 127 shown in FIG. 4, the substrate has been exposed to gas streams from the first reactive gas port 125 and the second reactive gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second reactive gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual reactive gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second reactive gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120 (also referred to as a gas distribution plate). The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150a, 150b. Rotating the substrate 60 along path 127 will move the substrate counterclockwise around the processing chamber 100. Thus, the substrate 60 will be exposed to the first processing region 250a through the eighth processing region 250h, including all processing regions between. For each cycle around the processing chamber, using the gas distribution assembly shown, the substrate 60 will be exposed to four ALD cycles of first reactive gas and second reactive gas.

The conventional ALD sequence in a batch processor, like that of FIG. 5, maintains chemical A and B flow respectively from spatially separated injectors with pump/purge section between. The conventional ALD sequence has a starting and ending pattern which might result in non-uniformity of the deposited film. The inventors have surprisingly discovered that a time based ALD process performed in a spatial ALD batch processing chamber provides a film with higher uniformity. The basic process of exposure to gas A, no reactive gas, gas B, no reactive gas would be to sweep the substrate under the injectors to saturate the surface with chemical A and B respectively to avoid having a starting and ending pattern form in the film. The inventors have surprisingly found that the time based approach is especially beneficial when the target film thickness is thin (e.g., less than 20 ALD cycles), where starting and ending pattern have a significant impact on the within wafer uniformity performance. The inventors have also discovered that the reaction process to create SiCN, SiCO and SiCON films, as described herein, could not be accomplished with a time-domain process. The amount of time used to purge the processing chamber results in the stripping of material from the substrate surface. The stripping does not happen with the spatial ALD process described because the time under the gas curtain is short.

Accordingly, embodiments of the disclosure are directed to processing methods comprising a processing chamber 100 with a plurality of processing regions 250a-250h with each processing region separated from an adjacent region by a gas curtain 150. For example, the processing chamber shown in FIG. 5. The number of gas curtains and processing regions within the processing chamber can be any suitable number depending on the arrangement of gas flows. The embodiment shown in FIG. 5 has eight gas curtains 150 and eight processing regions 250a-250h. The number of gas curtains is generally equal to or greater than the number of processing regions. For example, if region 250a had no reactive gas flow, but merely served as a loading area, the processing chamber would have seven processing regions and eight gas curtains.

A plurality of substrates 60 are positioned on a substrate support, for example, the susceptor assembly 140 shown FIGS. 1 and 2. The plurality of substrates 60 are rotated around the processing regions for processing. Generally, the gas curtains 150 are engaged (gas flowing and vacuum on) throughout processing including periods when no reactive gas is flowing into the chamber.

A first reactive gas A is flowed into one or more of the processing regions 250 while an inert gas is flowed into any processing region 250 which does not have a first reactive gas A flowing into it. For example if the first reactive gas is flowing into processing regions 250b through processing region 250h, an inert gas would be flowing into processing region 250a. The inert gas can be flowed through the first reactive gas port 125 or the second reactive gas port 135.

Referring again to FIG. 1, some embodiments of the disclosure incorporate a heater 300 located adjacent the bottom surface 143 of the susceptor assembly 140. The heater 300 can be spaced from the bottom surface 143 by any suitable distance or can be in direct contact with the bottom surface 143. The heater 300 illustrated is a disc-shaped component with a central opening 305 through which the support post 160 extends. The heater 300 can be connected to the support post 160 so that the heater 300 moves with the susceptor assembly 140 so that the distance from the bottom surface 143 remains the same. In some embodiments, the heater 300 rotates with the susceptor assembly 140. In some embodiments, the heater 300 is independent from the susceptor assembly 140 in that the movement of the heater 300 is separate from and independently controlled than the susceptor assembly 140.

The heater 300 illustrated in FIG. 1 includes heating elements 310. Each of the heating elements 310 can be separate elements independently controlled or can be a uniform coil of material that extends around the opening 305 forming a spiral shape when viewed from above. The heating elements 310 illustrated are arranged in three radial zones so that each zone is located at a different distance from the central opening 305. The inner zone 315a is closest zone to the support post 160 at the center of the susceptor assembly 140. The inner zone 315a is illustrated as three coils of heating elements 310a which can be a single coil or multiple coils. In some embodiments, the heating elements in any of the zones are separated into rotational zones. For example, in the illustrated embodiment, the left side of the heater 300 can have different coils than the right side, so that each of the radial zones has two rotational zones.

The second zone 315b is illustrated as being located below the recess 142 that supports the substrate 60. The heating elements 310b in the second zone 315b are shown closer to the bottom surface 143 of the susceptor assembly 140 than the heating elements 310a of the inner zone 315a. In some embodiments, the heating elements 310a of the inner zone 315a are closer to the bottom surface 143 than the second zone 315b heating elements 310b. In some embodiments, the heating elements 310a of the inner zone 315a and the heating elements 310b of the second zone 315b are about the same distance from the bottom surface 143.

The heating elements 310a of the first zone 315a are separated from the heating elements 310b of the second zone 315b by a first shield 320a. The size and shape of the first shield 320a can be any suitable dimensions and can be positioned at any distance from the bottom surface 143 of the susceptor assembly 140. In some embodiments, there is no first shield 320a separating the inner zone 315a from the second zone 315b.

The heating elements 310c of the outer zone 315c are illustrated as being located at the outer portion of the susceptor assembly 140. In some embodiments, the heating elements 310c of the outer zone 315c are separated from the heating elements 310b of the second zone 315b by a second shield 320b. In some embodiments, the heating elements 310c of the outer zone 315c are a different distance from the bottom surface 143 of the susceptor assembly 140 than one or more of the inner zone 315a and/or the second zone 315b. In some embodiments, the heater 300 includes more or less than three zones. For example, in some embodiments, there are four heater zones (not shown), an inner heating zone, a second heating zone, a third heating zone and an outer heating zone.

One or more embodiments of the disclosure advantageously provide heaters that can heat a wafer to 800° C. or higher. Some embodiments advantageously provide pyrolytic boron nitride/pyrolytic graphite (PBN/PG) heaters that can safely reach surface temperature of about 1200° C. Some embodiments of the disclosure provide apparatus that can provide wafer temperature uniformity less than or equal to about 2° C. Some embodiments provide heater that have very high watt densities (up to 100 watt/cm²) from large flat surfaces.

The batch processing chamber of some embodiments uses a large diameter graphite susceptor (plate) to support, heat and allow processing of six wafers simultaneously. The plate rotates during processing and receives heat from the heaters fixed in a chamber cavity below. The cavity is below the susceptor and is formed by a fluid cooled body maintained at a low temperature (e.g., 40-60° C.). The cavity provides penetrations to feed electrical power for a number of zones of heating, pump sensing, susceptor positioning camera viewing and human eye viewing. The heating zones can be positioned in the cavity at any elevation (e.g., 35 mm to 150 mm) below the susceptor as the susceptor can translate downward to transfer wafers.

PBN/PG heaters can provide a flat surface with extremely high watt densities (e.g., up to 100 W/cm²). Multiple PBN heaters may be connected to a common zone power supply to a pair of electrically isolated busbars inside the chamber allowing an array of PBN elements per zone. The PBN elements, in parallel connection to the common power supply, may have equal resistances to provide equal power outputs and operating temperatures.

Some embodiments advantageously provide flat plate PBN heaters with high density upward directed energy at the graphite susceptor in radially discreet control zones. For example, three separate control zones can provide the ability to manage uniform wafer temperature to less than one degree.

In some embodiments, the inner zone heater is replaced with a PBN heater. The inner zone PBN heater may provide good temperature uniformity by introducing high powers at the center of the susceptor. The replaced inner zone tubular heater may not provide sufficient power at the center of the susceptor due to, for example, high thermal losses down the rotation shaft and up to the aluminum injector. The PBN heater of some embodiments has a smaller outside diameter than a tubular heater with a higher watt density and may focus the energy nearer the center of the susceptor. In some embodiments, the flat PBN heaters can be located closer to the susceptor to provide more efficient temperature control than can be achieved with a tubular heater.

Figure 6A:
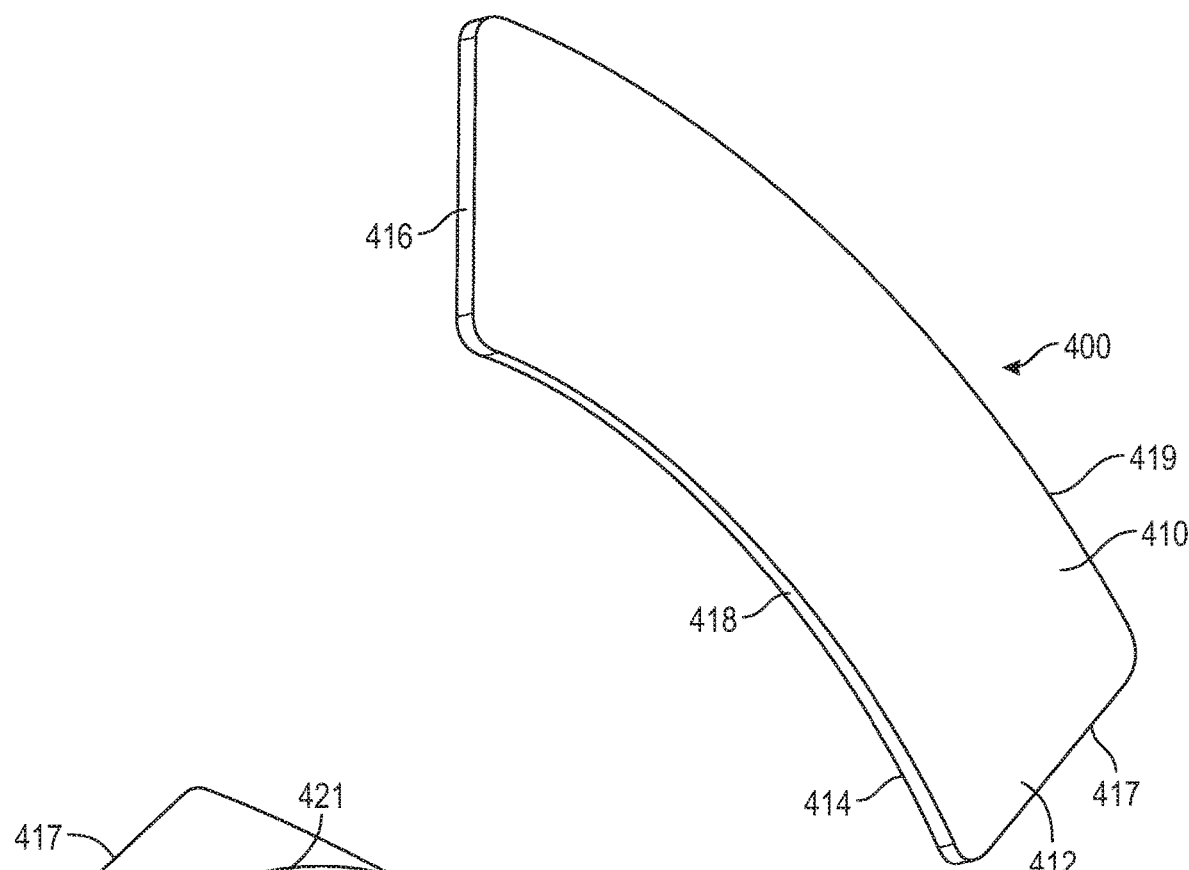
FIG. 6A shows a top view of a heater in accordance with one or more embodiment of the disclosure.
Figure 6B:
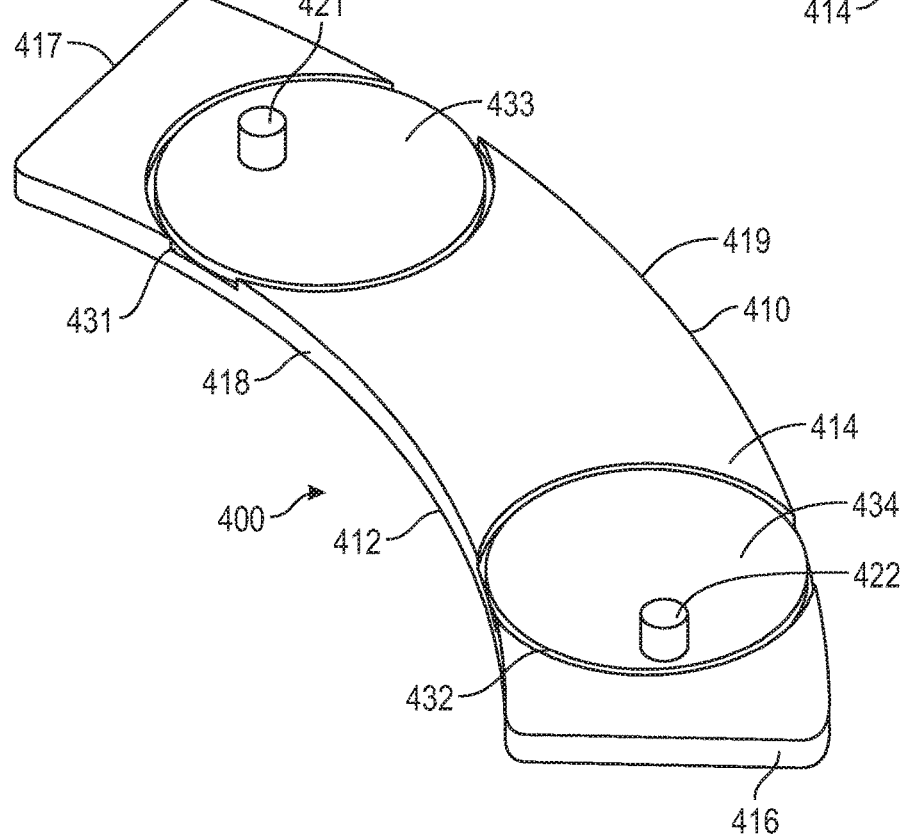
FIG. 6B shows a bottom view of the heater of FIG. 6A.
Figure 7:
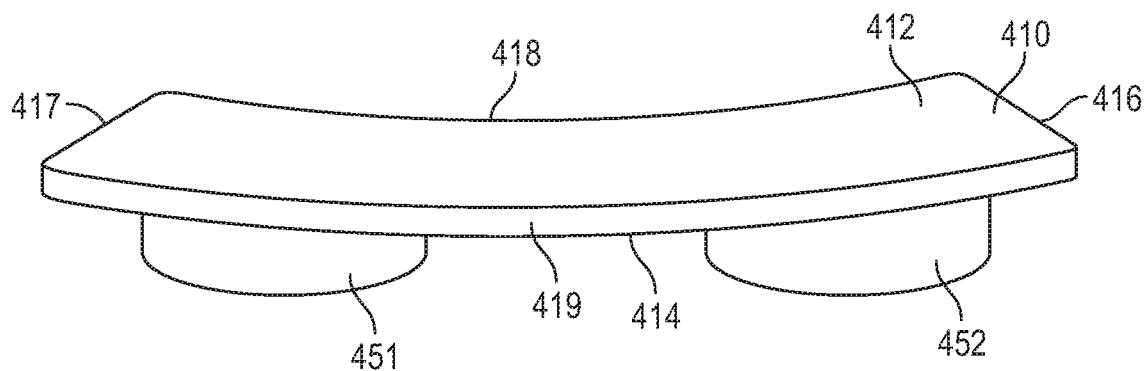
FIG. 7 shows a top view of a heater with standoffs in accordance with one or more embodiments of the disclosure.

Referring to FIGS. 6A, 6B and 7, one or more embodiments of the disclosure are directed to heaters 400. FIG. 6A shows a top view of the heater 400 and FIG. 6B shows a bottom view of the heater 400. As used in this manner, the relative terms "top" and "bottom" are used to describe different views of the heater 400 and should not be taken as implying a specific spatial direction. The heater 400 has a body 410 with a top 412 and a bottom 414.

In some embodiments, the body 410 is a rectangular shaped component with straight sides. In some embodiments, as illustrated, the body 410 is a curved component having a first end 416 and a second end 417 connected by an arc-shaped inner end 418 and an arc-shaped outer end 419.

The body 410 can be made of any suitable material. In some embodiments, the body 410 comprises pyrolytic boron nitride (PBN), pyrolytic graphite (PG) or a mixture of PBN/PG. In some embodiments, the mixture of PBN/PG has a ratio of PBN:PG in the range of about 100:1 to about 1:100. In some embodiments, the body 410 of the heater 400 consists essentially of PBN. As used in this manner, the term "consists essentially of PBN" means that the composition is greater than 99% or 99.5% PBN, on a weight basis.

The heater 400 includes a first heater electrode 421 and a second heater electrode 422 connected to the bottom 414 of the body 410. The first heater electrode 421 and the second heater electrode 422 can be made of any suitable material that can efficiently conduct electricity. In some embodiments, the first heater electrode 421 and/or the second heater electrode 422 are made of material comprising molybdenum.

Figure 8:
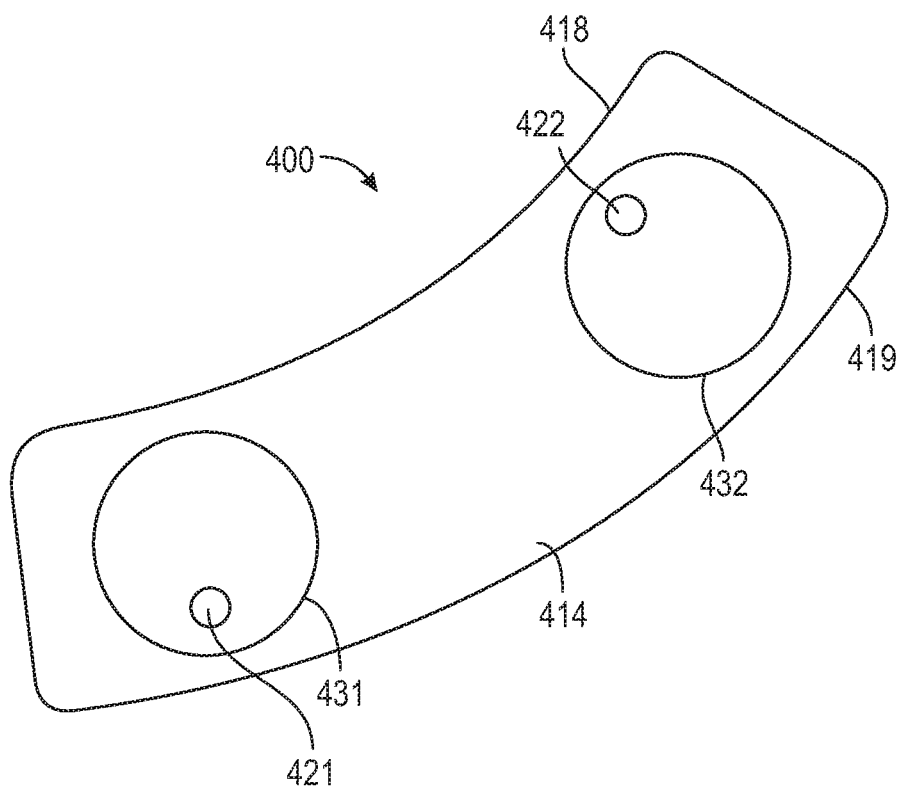
FIG. 8 shows a bottom view of a heater in accordance with one or more embodiments of the disclosure.

The positioning of the heater electrodes can vary depending on, for example, the location of power source connections. In some embodiments, the first heater electrode 421 is located closer to the inner end 418 or the outer end 419 than the second heater electrode 422. FIG. 8 illustrates a bottom view of the heater 400 showing the first heater electrode 421 closer to the outer end 419 than the inner end 418 and the second heater electrode 422 closer to the inner end 418 than to the outer end 419.

Some embodiments of the heater 400 include a first recess 431 and a second recess 432 on the bottom 414 of the body 410. The recesses can be any suitable shape and width. In the embodiment illustrated in FIG. 6B, the recesses 431, 432 are circular and the first heater electrode 421 is within the bounds of the first recess 431 and the second heater electrode 422 is within the bounds of the second recess 432. in the illustrated embodiments, there is a first raised portion 433 in the first recess 431 and a second raised portion 434 in the second recess 432. The raised portions 433, 434 are sized so that the recesses 431, 432 have a suitable width to support a separate component. In some embodiments, the recesses 431, 432 have an outer diameter in the range of about 40 mm to about 150 mm, or in the range of about 50 mm to about 140 mm, or in the range of about 60 mm to about 130 mm in some embodiments, the width of the recesses 431, 432 are greater than or equal to about 2 mm, 3 mm, 4 mm, 5 mm, 10 mm or 15 mm.

In some embodiments, as illustrated in FIG. 7, a first standoff 451 is positioned in the first recess 431 and a second standoff 452 is positioned in the second recess 432. The standoffs 451, 452 can be made of any suitable electrically insulating (i.e., non-conductive) material that can be used to isolate power connections. In some embodiments, the standoffs 451, 452 are quartz. In some embodiments, the standoffs have a bottom comprising an electrically insulating material, for example, quartz.

Figure 9:
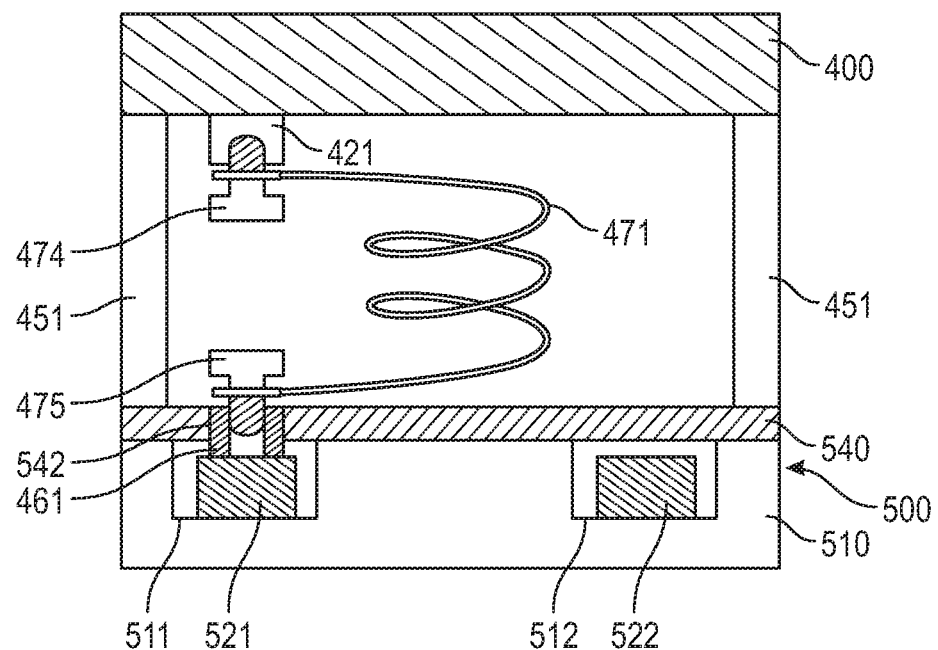
FIG. 9 shows a cross-sectional view of a portion of a heater with standoff and busbars in accordance with one or more embodiments of the disclosure.

The connection to the power source can occur through the heater electrodes 421, 422 by connection with a busbar connector. The busbar connector can be formed into the bottom of and extending through the standoffs or can be a separate component connected to the electrodes. The busbar connectors can be considered a part of the standoffs even when a separate component. In some embodiments, as shown in FIG. 9, the first busbar connector 461 is a separate component that passes through a busbar cover 540 to contact the first busbar 521.

In some embodiments, a first wire 471 connects the first busbar connector 461 to the first heater electrode 421. In a similar arrangement, a second wire (not shown) connects the second busbar connector (not shown) to the second heater electrode 422. The first wire 471 is located within the first standoff 451 and the second wire is within the second standoff.

The first wire 471 can be connected to the first heater electrode 421 and the first busbar connector 461 by any suitable connector. In some embodiments, a screw 474 and, optionally, washer (not shown) connect the first wire 471 to the first heater electrode 421. In some embodiments, a screw 475 and, optionally, washer or connecting ring (not numbered), connect the first wire 471 to the first busbar connector 461. The second wire can be connected to the second heater electrode and the second busbar connector by a suitable connector similar to that of the first wire 471. In some embodiments, the wire comprises braided molybdenum. In some embodiments, the screw and optional washer are molybdenum.

Figure 10:
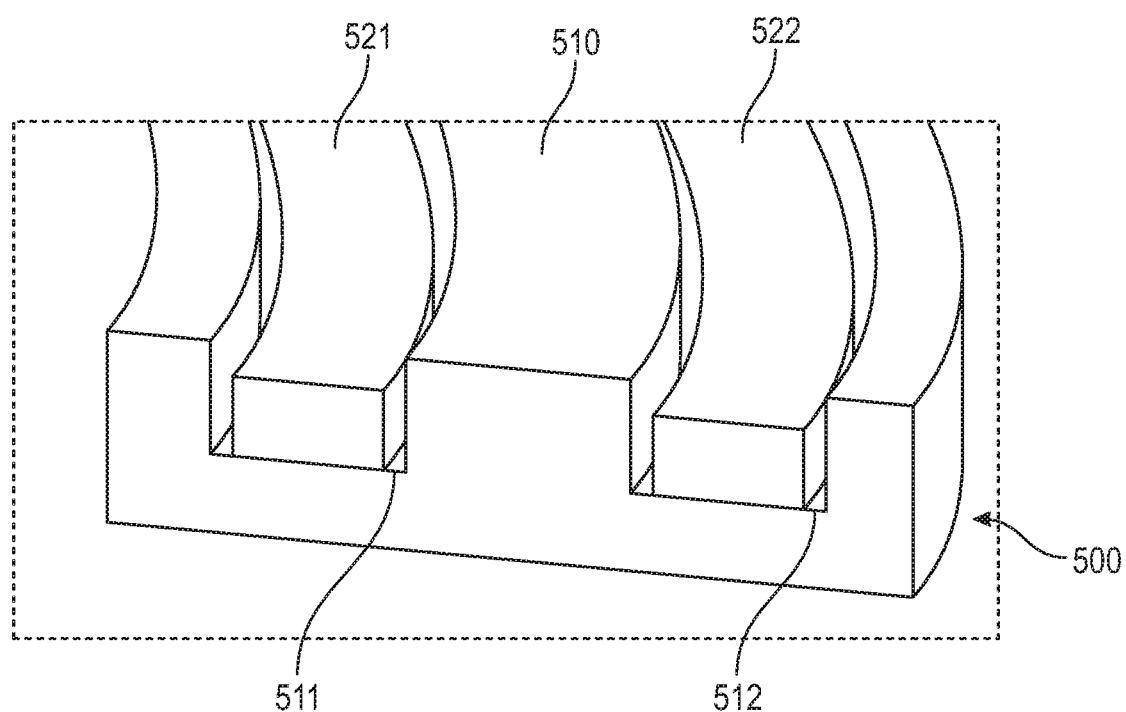
FIG. 10 shows a view of a busbar assembly in accordance with one or more embodiment of the disclosure.

Referring to FIG. 10, some embodiments include a busbar assembly 500. The busbar assembly 500 can include an electrically insulating busbar housing 510 (also called a raceway) comprising two channels 511, 512. A first busbar 521 can be positioned within the first channel 511 and a second busbar 522 can be positioned within the second channel 512. In use, the first busbar 521 is in electrical communication with the first busbar connector 461 and the second busbar 522 is in electrical communication with the second busbar connector 462. The first busbar 521 and the second busbar 522 can be connected to one or more power source to provide a voltage differential between the first busbar 521 and the second busbar 522.

The busbar housing 510 can be made from any suitable electrically insulating material. In some embodiments, the busbar housing 510 comprises alumina. In some embodiments, the busbar housing 510 is made of segmented alumina which may act to conduct heat away from the busbars during use.

Referring back to FIG. 9, some embodiments of the busbar assembly 500 include a busbar cover 540. The busbar cover 540 can have a channel or opening 542 to allow the busbar connector 461, 462 to make contact with the busbar 521, 522.

Figure 11:
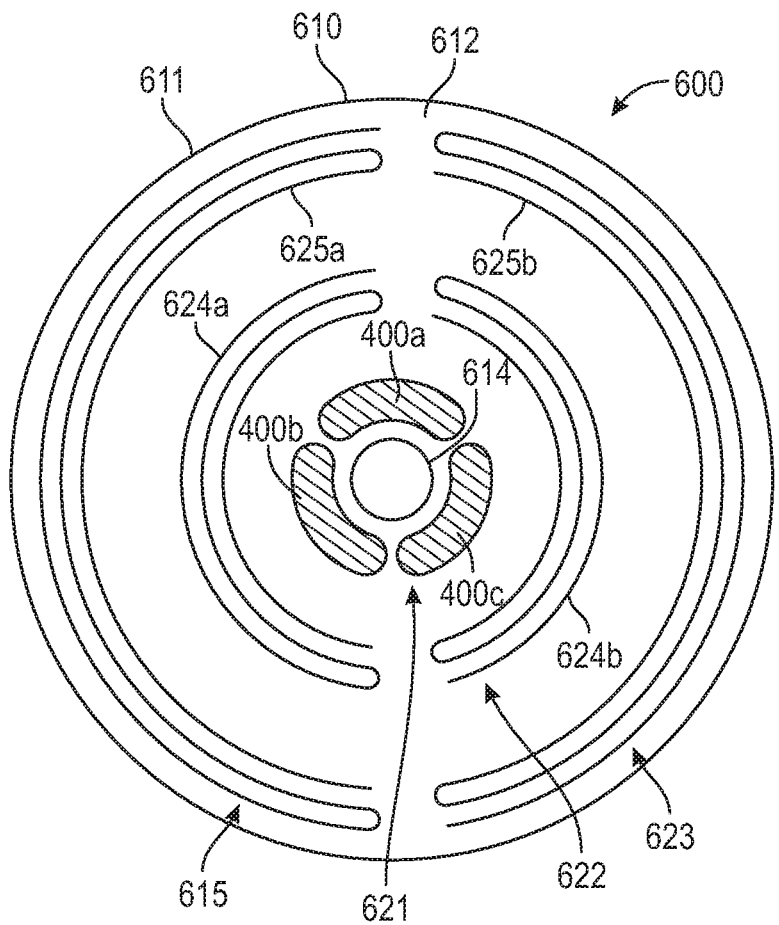
FIG. 11 shows a view of a heater assembly in accordance with one or more embodiment of the disclosure.

Referring to FIG. 11, some embodiments of the disclosure are directed to heater assemblies 600. The heater assembly 600 of some embodiments has a round body 610 with a bottom 612 and an opening 614 in the center of the body 610. A sidewall 611 forms an outer periphery of the body 610 around the bottom 612. The sidewall 611 and bottom 612 define a cavity 615 within the body 610.

The heater assembly 600 includes at least one heater zone 621. In the embodiment illustrated in FIG. 11, there are three radial zones: an inner zone 621, a second zone 622 and an outer zone 623. Each of the radial zones can be controlled independently of the other zones. In some embodiments, there are more than three radial zones. Any of the zones can be separated from an adjacent zone by a heat shield (as shown in FIG. 1). The inner zone is the zone closest to the opening 614 and may be referred to as the first zone. The outer zone is the zone closest to the sidewall 611. The zones between the inner zone 621 and the outer zone 623 are referred to as the second zone, third zone, fourth zone, etc. The inner zone may be located a distance from the opening 614 that allows the heating zone to be formed around the periphery of the support post 160 (see FIG. 1).

Each radial zone can be made up of one or more rotational zones. In the illustrated embodiment, the inner zone 621 has three rotational zones made up of heater 400a, heater 400b and heater 400c. The second zone 622 has two rotational zones made up of heating element 624a and heating element 624b. The outer zone 623 also has two rotation zones made up of heating element 625a and heating element 625b. In some embodiments, each of the radial zones has the same number of rotational zones.

In the illustrated embodiment, the inner zone 621 comprises PBN heaters 400 and the second zone 622 and outer zone 623 are tubular heating elements. In some embodiments, the inner zone 621, second zone 622 and outer zone 623 comprise PBN heaters 400.

Figure 12:
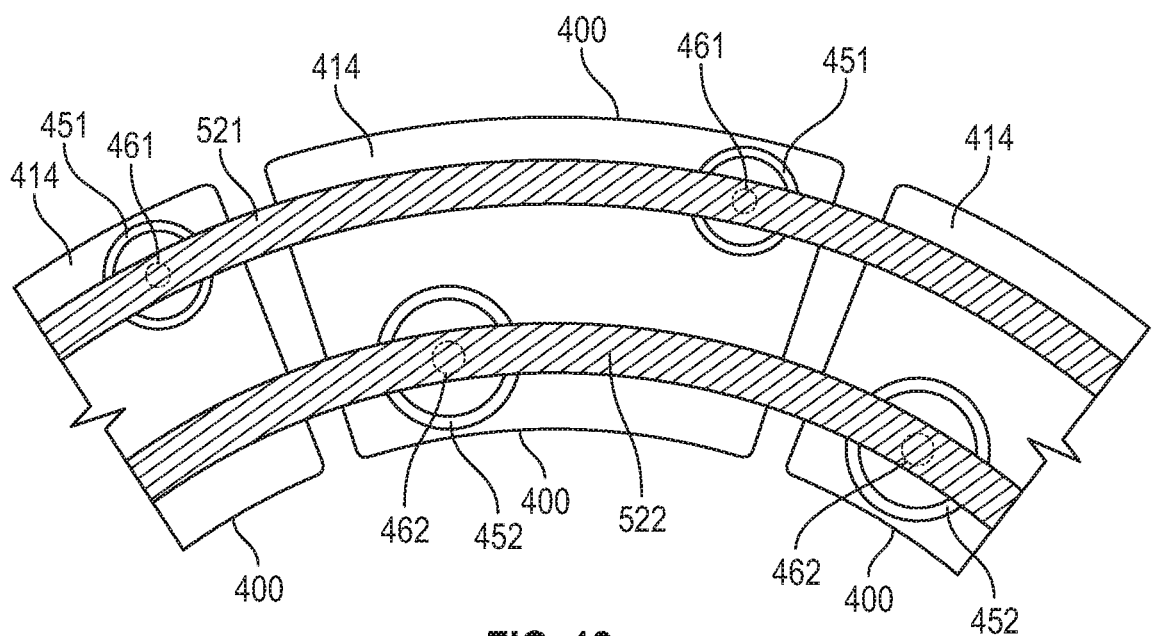
FIG. 12 shows a partial view of a heating zone with a plurality of PBN heaters in accordance with one or more embodiment of the disclosure.

FIG. 12 shows a portion of a heating zone with a plurality of heaters 400. The busbars 521, 522 are shown not in a busbar housing for clarity purposes. The first standoff 451 and first busbar connector 461 are located to contact the first busbar 521. The second standoff 452 and second busbar connector 462 are located to contact the second busbar 522. The plurality of heaters 400 can be arranged to form a heating zone that encircles the opening 614.

Some embodiments of the disclosure are directed to processing chambers incorporating the heater 400 or heating assembly 600. The heating assembly 600 is positioned below the susceptor assembly 140 around the support post 160. One or more heat shields can be positioned between the different heating zones.

While the foregoing is directed to embodiments of the present disclosure, other and further embodiments of the disclosure may be devised without departing from the basic scope thereof, and the scope thereof is determined by the claims that follow.

What is claimed is:

1. A heater comprising:
   a body comprising pyrolytic boron nitride (PBN), the body having a top and a bottom, the body having a first end and a second end connected by an arc-shaped inner end and an arc-shaped outer end, the bottom of the body having a first recess and a second recess, each of the first recess and the second recess having a raised portion therein, the raised portion in each of the first recess and the second recess extending toward the bottom of the body;
   a first heater electrode connected to the bottom of the body, the first heater electrode within the first recess;
   a second heater electrode connected to the bottom of the body, the second heater electrode within the second recess; and
   a first standoff positioned within the first recess and enclosing the first heater electrode, and a second standoff positioned within the second recess and enclosing the second heater electrode, the first standoff and the second standoff comprising an electrically insulating material.

2. The heater of claim 1, wherein the body of the heater consists of PBN.

3. The heater of claim 1, wherein the first standoff and the second standoff comprise quartz.

4. The heater of claim 1, wherein the first standoff and the second standoff have a bottom comprising an electrically insulating material.

5. The heater of claim 4, wherein the first standoff has a first busbar connector extending through the bottom of the first standoff and the second standoff has a second busbar connector extending through the bottom of the second standoff.

6. The heater of claim 5, further comprising a first wire connecting the first busbar connector to the first heater electrode and a second wire connecting the second busbar connector to the second heater electrode, the first wire within the first standoff and the second wire within the second standoff.

7. The heater of claim 6, further comprising a first busbar and a second busbar, the first busbar in electrical communication with the first busbar connector and the second busbar in electrical communication with the second busbar connector.

8. The heater of claim 7, wherein the first busbar and the second busbar are within an electrically insulating busbar housing, the first busbar within a first channel in the busbar housing and the second busbar within a second channel in the busbar housing.

9. The heater of claim 5, wherein the first busbar connector and the second busbar connector extend parallel to each other along an arc-shape conforming to and disposed between the arc-shaped inner end and arc-shaped outer end of the body of the heater.

10. The heater of claim 9, wherein the first heater electrode is located closer to the arc-shaped inner end than the arc-shaped outer end, and the second heater electrode is located closer to the arc-shaped outer end than the arc-shaped inner end; or wherein the first heater electrode is located closer to the arc-shaped outer end than the arc-shaped inner end, and the second heater electrode is located closer to the arc-shaped inner end than the arc-shaped outer end.

11. The heater of claim 1, wherein the body of the heater is configured for placement adjacent a bottom surface of a susceptor assembly.

12. The heater of claim 11, wherein the body of the heater is configured for connection to a support post of the susceptor assembly.

13. The heater of claim 12, wherein the body of the heater is configured to move together with the susceptor assembly.

14. The heater of claim 12, wherein the body of the heater is configured to move independent of the susceptor assembly.

* * * * *